(12) United States Patent
Juengling et al.

(10) Patent No.: US 6,777,813 B2
(45) Date of Patent: Aug. 17, 2004

(54) FILL PATTERN GENERATION FOR SPIN-ON-GLASS AND RELATED SELF-PLANARIZATION DEPOSITION

(75) Inventors: Werner Juengling, Boise, ID (US); Philip J. Ireland, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 273 days.

(21) Appl. No.: 10/032,877

(22) Filed: Oct. 24, 2001

(65) Prior Publication Data

US 2003/0168741 A1 Sep. 11, 2003

(51) Int. Cl.$^7$ .......................... H01L 23/48; H01L 23/52; H01L 29/40
(52) U.S. Cl. ....................... 257/775; 257/773
(58) Field of Search .................... 257/773, 775, 257/762, 763; 438/426, 631, 646, 424, 129

(56) References Cited

U.S. PATENT DOCUMENTS

| | | | | |
|---|---|---|---|---|
| 5,763,955 A | * | 6/1998 | Findley et al. | 257/775 |
| 5,854,125 A | * | 12/1998 | Harvey | 438/626 |
| 5,861,342 A | * | 1/1999 | Gabriel et al. | 438/631 |
| 5,885,856 A | | 3/1999 | Gilbert et al. | |
| 5,926,733 A | | 7/1999 | Heo | |
| 5,981,384 A | | 11/1999 | Juengling | |
| 6,099,992 A | | 8/2000 | Motoyama et al. | |
| 6,178,543 B1 | | 1/2001 | Chen et al. | |
| 6,178,853 B1 | * | 1/2001 | Huang | 81/54 |
| 6,504,254 B2 | | 1/2003 | Takizawa | |

FOREIGN PATENT DOCUMENTS

JP      2001 313293      11/2001

* cited by examiner

Primary Examiner—Craig A. Thompson
Assistant Examiner—William Vesperman
(74) Attorney, Agent, or Firm—Dinsmore & Shohl

(57) ABSTRACT

A fill pattern for a semiconductor device such as a memory cell. The memory cell includes a plurality of first topographic structures comprising conductive lead lines deposited on a semiconductor substrate, and a plurality of second topographic structures comprising fill patterns such that the top surfaces of the second topographic structures are generally coplanar with the top surfaces of the plurality of first topographic structures. The plurality of first and second topographic structures are arranged in a generally repeating array on the substrate. A planarization layer is deposited on top of the substrate such that it fills the space between the plurality of first and second topographic structures, with its top surface generally coplanar with that of the top surfaces of the first and second topographic structures.

5 Claims, 13 Drawing Sheets

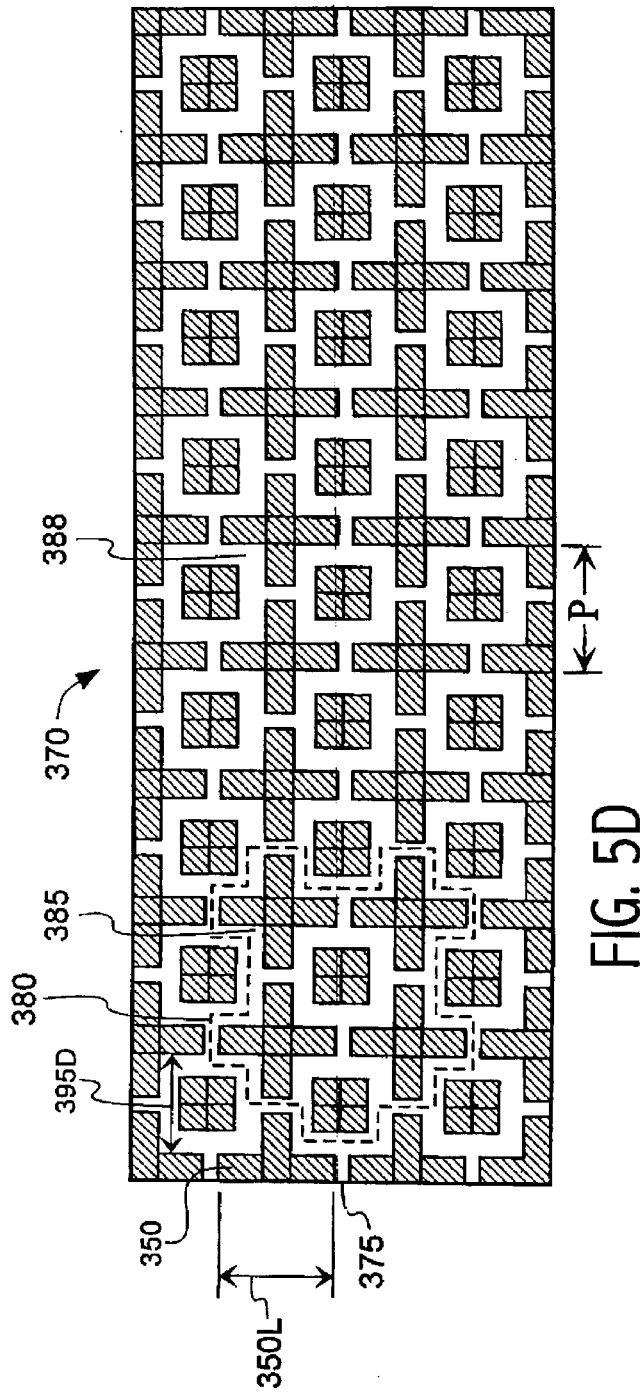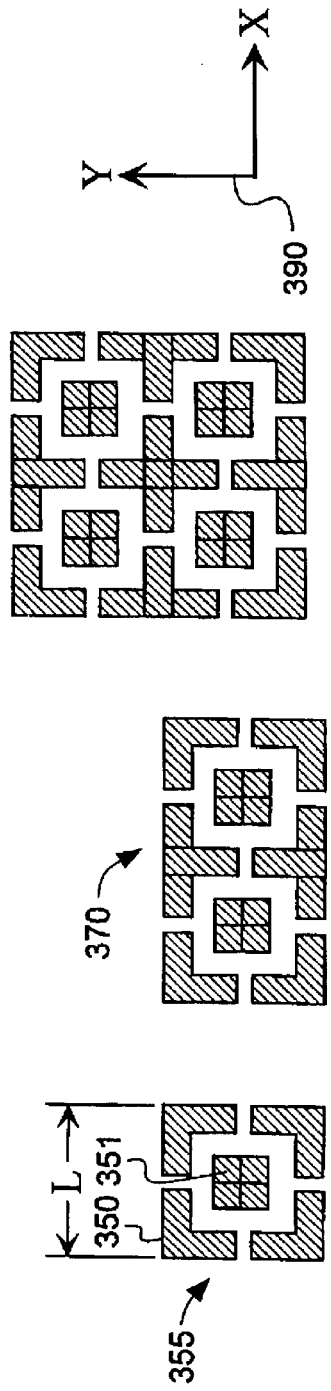

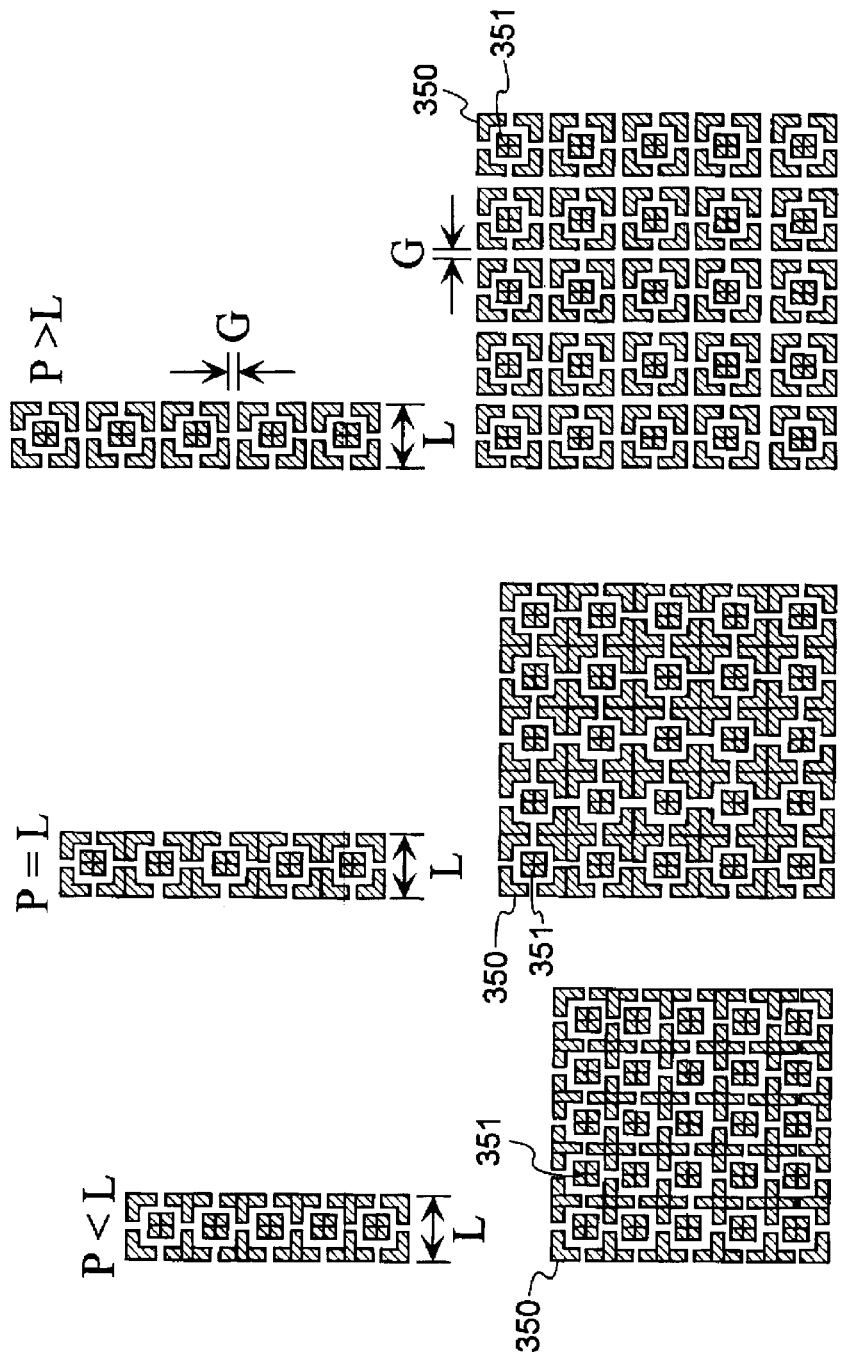

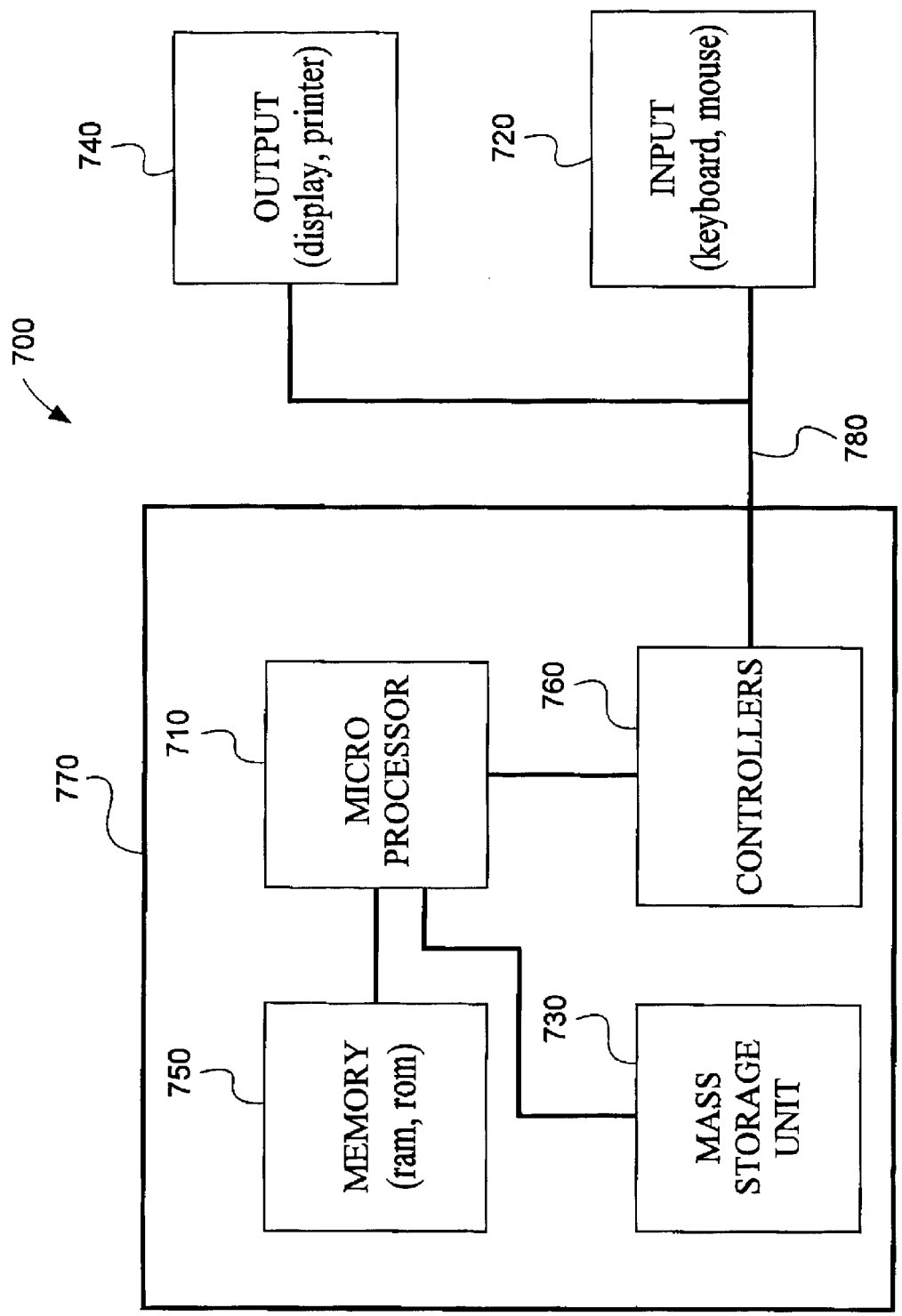

FILL PATTERN GENERATION FOR SPIN-ON-GLASS AND RELATED SELF-PLANARIZATION DEPOSITION

BACKGROUND OF THE INVENTION

The present invention relates generally to improved fill patterns for semiconductor devices, and more particularly to geometrically simple arrays of fill patterns interspersed among conductive elements to promote the formation of an insulating planarization layer.

The deposition of the numerous layers is one of the key steps in the fabrication of semiconductor devices, where typically alternating patterns of conductive and nonconductive materials are topographically formed on a semiconductor substrate. In a typical photolithographic process, a patterned reticle is employed to provide masking of selected sections of a resist layer on both the semiconductor substrate and subsequent layers, repeated through numerous steps to build a three-dimensional network of connectors. However, the addition of multiple layers causes the topographic projection to become more and more nonplanar; these surface undulations can lead to a loss of resolution in the lithographic masking process.

It is therefore highly desirable from a process and quality control perspective to have as little surface undulation as possible on the built-up semiconductor device. One way to minimize the surface undulation is to planarize each exposed surface with one or more insulative layers using known procedures, such as spin-on glass (SOG) or chemical vapor deposition (CVD) methods. One commonly used material in this CVD process is tetraethylorthosilicate (TEOS). When either of these approaches are used to deposit a layer over large tracts of non built-up area, they tend to produce tapered layer thickness variations near the topographic regions in a manner similar to that of a meniscus formed near a container wall due to surface tension in a liquid. To achieve the desired level of planarization, it is precisely this conformal behavior, prevalent in wide-open areas, that substrate designers have been trying to avoid. Similarly, when spacing widths between the rigid upstanding structures varies, the aforementioned layer fill techniques are less than wholly effective at achieving the desired planarization, as spaces of varying size permit disparate amounts of SOG or TEOS to flow into them, and at different rates.

Additional methods have been employed to improve the planarity of insulative layers. One well-known approach involves the placement of "dummy" or fill patterns in between the topographic conductive elements to reduce the incidence of conformal dips in the insulative layer. The presence of these fill patterns which, by interrupting otherwise large tracts of unsupported fill area, subdivide and create smaller valley- or grid-like regions for SOG or TEOS layers to fill. However, the addition of fill patterns adds complexity, as additional steps must be included to ensure their mechanical and electrical compatibility. For example, since many fill patterns are metal (often deposited simultaneously with the conductive element steps), they can be a source of unwanted conductivity or capacitance. Similarly, a lack of uniformity of spacing between the patterns making up the fill pattern array hampers the even distribution of the layers. The relatively non-uniform spacing between adjacent topographic structures also militates against lower processing costs, where these considerations dictate that fill patterns and the arrays made therefrom be as simple as possible. The cost of depositing customized, non-uniform fill patterns can have a significant impact on fabrication cost; on the other hand, improper attention to a grid or valley layout between fill patterns can lead to spaces that, if inclusive of long straight paths and high throughflow intersections, will exhibit uneven planarization layer flow, and subsequent undulated layer deposition. Accordingly, fill pattern size and spacing become critical design considerations to the person responsible for the circuit layout.

Accordingly, the need exists for devices in which fill patterns can be consistently and substantially planar across the entire region of the upper surface of the semiconductor device to provide inexpensive, compact and reliable structures.

SUMMARY OF THE INVENTION

The present invention satisfies the aforementioned need by providing a planarized semiconductor device and a system which utilizes a reticle configuration that promotes the formation of a planarized landscape on the surface of a semiconductor device. The various layers, regions, and structures of the embodiments of the device according to the present invention may be formed by utilizing conventional semiconductor device fabrication techniques. The selection of these specific techniques may vary from application to application and, with the exception of the fabrication steps outlined herein, is not the subject of the present invention.

According to an aspect of the present invention, a method of fabricating a semiconductor device is disclosed, where the steps include: providing a generally planar semiconductor wafer substrate made up of substantially orthogonal first and second in-plane dimensions; defining a topographic layer of conductive lead line material such that it comprises at least first and second sides that extend coplanar with the wafer substrate; depositing one or more topographic layers of conductive lead line material on the substrate; depositing a plurality of topographic fill patterns adjacent either the conductive lead line material or another fill pattern such that spaces defined between the topographic structures possess substantially equal width as any other space; arranging the topographic fill patterns and the topographic layers of conductive lead line material so that a grid defined by a plurality of crossings of the spaces contains no linear dimension longer than the longest dimension of any one of the topographic fill patterns, and that no intersection defined by any of the plurality of crossings includes uninterrupted linear dimensions. An additional step includes depositing a planarization layer over the substrate such that it fills up the grid pattern, laterally surrounding the topographic structures of conductive lead line material and fill patterns.

Optionally, the step of depositing the insulative layer includes depositing either a layer of spin-on glass or TEOS. In addition, the deposition of the insulative layer produces a top surface substantially co-planar with a top surface of the layers of conductive lead line material and the fill patterns. An additional step may include defining an array comprising at least one of the fill patterns and conductive lead line layers such that no portion of any of the fill patterns overhang the array boundary. The array can be thought of as containing numerous topographic structures repeated in a fairly regular geometric pattern such that it takes on a relatively uniform appearance. One way to achieve a regular geometric pattern is to have the periphery of the array be mostly bounded by the straight-edged sides of the fill patterns.

According to another aspect of the present invention, a semiconductor is disclosed. The semiconductor includes a substantially planar substrate with first and second topographic patterns, or structures, defined by active lead lines and dummy fills (both also referred to as peaks), respectively deposited on the substrate. A repeating array, which itself includes a substantially planar grid comprising a plurality of interconnected valleys circumscribing the first and second topographic patterns, is disposed over the substrate, and is configured such that the array periphery is substantially bounded by straight edges of the dummy fills, active lead lines, or combination of both. Furthermore, no portion of any of the dummy fills extends laterally beyond the periphery. Within the grid, the longest linear dimension of each of the valleys is no longer than the longest lateral dimension of any of the dummy fills, and no intersection defined by a crossing between any two valleys includes uninterrupted linear dimensions. In the alternate, a plurality of first and second topographic structures deposited over planar substrate, where the first are conductive lead lines, and the second are fill/dummy patterns, both including top surfaces thereon that are generally co-planar with one another. In addition, a planarization layer deposited over the substantially planar substrate such that it is disposed at least within the gridded valley and laterally surrounds the first and second topographic structures.

Optionally, the semiconductor further may include a substantially planar layer of insulative material deposited over the valleys, and has a thickness selected to render a top surface of the substantially planar layer substantially co-planar with a top surface of the peaks. In addition, the semiconductor device further includes a lateral dimension defining a width of any one of the interpeak spaces such that it is substantially as wide as all other interpeak spaces. This ensures a relatively constant spacing between adjacent peaks, whether the peaks be topographic conductive lead lines or topographic dummy patterns. Additionally, the insulative material on the semiconductor is an oxide-based ceramic.

In still another aspect of the present invention, a memory cell is disclosed. The device includes, in addition to the semiconductor configuration of the previous embodiment, a switching device (such as a transistor) and a charge storage device (such as a capacitor) in electrical communication with the switching device. The substrate defines first and second orthogonal in-plane dimensions. The first topographic structures are made up of conductive lead lines in electrical communication with the switching device. The second topographic structures include a top surface generally co-planar with the top surfaces of the first topographic structures. The gridded valley is made up of a first set of interconnected series of spaces that extend in the first orthogonal in-plane dimension, and a second set of interconnected series of spaces that extend in the second orthogonal in-plane dimension.

Optionally, the memory cell includes a width of each of the interconnected series of spaces that is between 0.25 and 0.5 micron, and the second topographic structures define first and second in-plane dimensions extending in first and second orthogonal in-plane dimensions. At least one of the fill patterns may overlap with at least one adjacent fill pattern along at least one of the first and second in-plane dimensions. Also, the second topographic structures may be any of a variety of geometric shapes. Additionally, the first and second topographic structures may be made of the same material.

In still another aspect of the invention, a reticle used to make a memory cell is disclosed. The reticle comprises a surface into which plurality of lead line cutouts and a plurality of fill pattern cutouts are made. The cutouts are adapted to define topographic peaks on the surface of a semiconductor, where the lead line cutouts are shaped to further define at least one lead line, and the fill pattern cutouts define a plurality of dummy patterns spaced apart from one another. The fill pattern cutouts are interspersed between the lead line cutouts, and are spaced apart from each of the lead line cutouts by an amount sufficient to avoid capacitive communication between a metal lead line and a metal fill pattern formed on a memory cell by the reticle. The lead line and fill pattern cutouts are disposed in an array within a surface of the reticle such that the periphery of the array is substantially bounded by straight edges, and that no portion of any of the fill pattern cutouts within the array extends laterally beyond the periphery. A grid, which is part of the reticle surface remaining after the fill pattern and lead line cutouts have been created, includes an interconnected series of spaces between adjacent cutouts. A lateral distance defining a width of any one of the series of spaces is substantially equal to that of any other of the series of spaces within the grid, while the longest linear dimension between each of the series of spaces is no longer than the longest dimension of any of the fill pattern cutouts. Furthermore, no intersection defined by a crossing between any two of the interconnected series of spaces includes uninterrupted linear dimensions.

Optionally, the fill pattern cutouts are any of a variety of geometric shapes. In addition, at least one of the fill pattern cutouts further define a first in-plane dimension and a second in-plane dimension substantially orthogonal to the first in-plane dimension such that at least one of the fill pattern cutouts overlaps with at least one adjacent fill pattern cutout along at least one of the first or second in-plane dimensions. Also, a lateral dimension defining a width of any one of the interconnected series of spaces is substantially the same between all other the series of spaces.

In yet another aspect of the invention, a semiconductor fabrication system is disclosed. The semiconductor fabrication system includes: a photoresist application mechanism to deposit photoresist onto a semiconductor substrate; an electromagnetic radiation source to illuminate at least a portion of the photoresist; a solvent dispensing mechanism to wash away unexposed photoresist; an etching mechanism to selectively remove at least one layer of insulative coating; and a reticle with a generally planar body similar to that of the previous embodiment.

In yet another aspect of the present invention, a motherboard assembly employing memory cells is disclosed. The motherboard includes a generally planar board, a plurality of interconnect devices to provide electrical communication between the motherboard and various input, output and memory devices, and mounts for a microprocessor, plurality of memory devices and plurality of controller sets, all of which are mounted to the generally planar board. The motherboard also includes at least one semiconductor mounted to the generally planar board, where the semiconductor is from the group consisting of the microprocessors, memory devices and controllers. The semiconductor is similar to that of the previously discussed embodiments.

In yet another aspect of the present invention, a computer system employing memory cells is disclosed. The computer system includes a microprocessor, at least one input electrically coupled to the microprocessor, a mass storage unit electrically coupled to the microprocessor, an output electrically coupled to the microprocessor and at least one memory device adapted to store computer programs for use by the microprocessor such that it is electrically coupled to the microprocessor. The memory device is similar to that of the previously discussed embodiments.

In still another aspect of the present invention, a method of fabricating a reticle is disclosed, the method including the steps of producing a plurality of lead line cutouts in a reticle body; producing a plurality of fill pattern cutouts interspersed between the plurality lead line cutouts, and forming a grid comprising an interconnected series of spaces. The structure of the reticle is similar to that of the previous reticle embodiment.

These and other objects and advantages of the invention will be apparent from the following description, the accompanying drawings, and the appended claims.

BRIEF DESCRIPTION OF THE DRAWINGS

FIG. 5A is a top view of a single fill pattern according to one embodiment of the present invention;

FIG. 5B is a top view of a pair of fill patterns overlapping in one dimension according to one embodiment of the present invention;

FIG. 5C is a top view of a simple repeating array of fill patterns according to the present invention;

FIG. 5D is a top view of an extension of the embodiment of FIG. 5C;

FIG. 6A is a top view of a fill pattern extending horizontally, vertically and in a horizontal-vertical plane, in all cases where the pitch is less than the lateral spacing of the pattern;

FIG. 6B is a top view of a fill pattern extending horizontally, vertically and in a horizontal-vertical plane, in all cases where the pitch is equal to the lateral spacing of the pattern;

FIG. 6C is a top view of a fill pattern extending horizontally, vertically and in a horizontal-vertical plane, in all cases where the pitch is greater than the lateral spacing of the pattern;

FIG. 10 is a block diagram showing the various parts of a computer system according to an embodiment of the present invention.

DESCRIPTION OF THE PREFERRED EMBODIMENTS

Figure 1A:
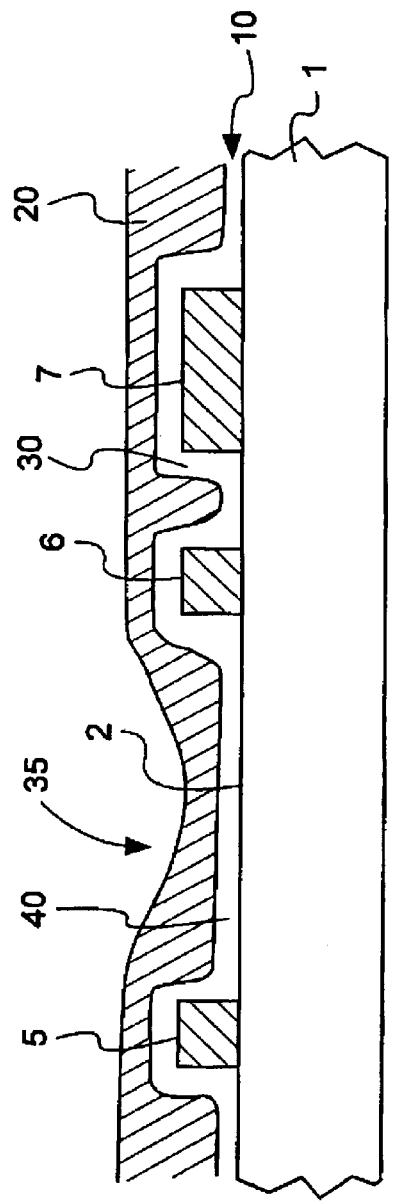
FIG. 1A is an elevation view of a semiconductor device without fill patterns according to the prior art.
Figure 1B:
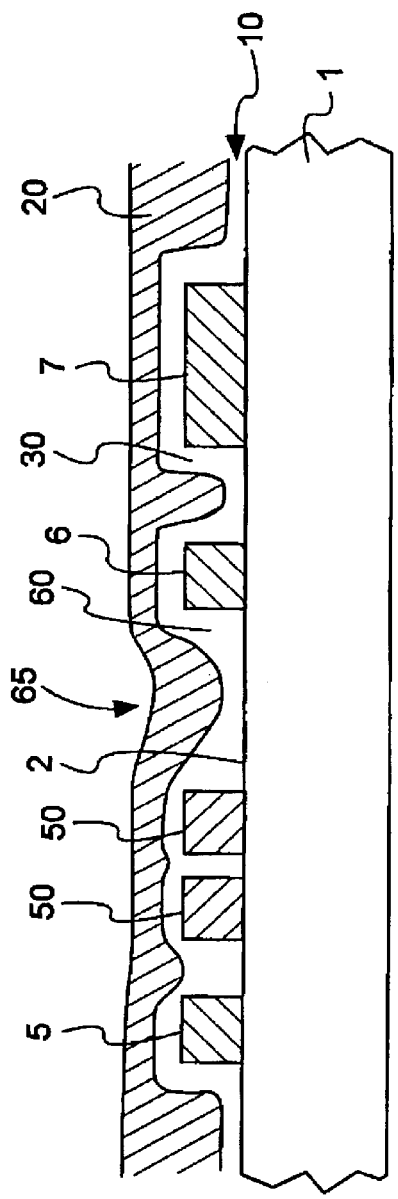
FIG. 1B is an elevation view of a semiconductor device with fill patterns according to the prior art.

Referring to FIGS. 1A and 1B, the prior art semiconductor devices include a substrate 1 with an upper surface 2 onto which electrically conductive leads 5, 6 and 7 are deposited. Typically, a low dielectric insulation layer 10 is placed over the leads and remaining exposed substrate upper surface 2. A planarization layer 20 is then deposited on top of the dielectric layer 10 to smooth out the surface undulations caused by the conductive lead lines 5, 6 and 7. Well-known approaches, such as SOG and CVD of TEOS are used to deposit and disperse the planarization layer 20 while still in its liquid (albeit viscous) state. While the planarization later 20 is generally effective at filling relatively tight spaces 30 between lead lines, the outward-pushing force caused by the spinning motion of the SOG process tends to leave semiconformal troughs 35 in larger spaces, such as space 40. The addition of dummy patterns 50 (alternatively referred to as fill patterns), as specifically shown in FIG. 1B, tends to ameliorate most of the trough problem, although uneven fill pattern spacing can result in a remaining wide space 60, still leaving an uneven distribution of planarization layer 65. In some situations, the placement of dummy patterns 50 is such that they can capacitively react with conductive lead lines 5, 6 and 7 if placed too close. This can corrupt the electrical signals passing through the lead.

Figure 2:
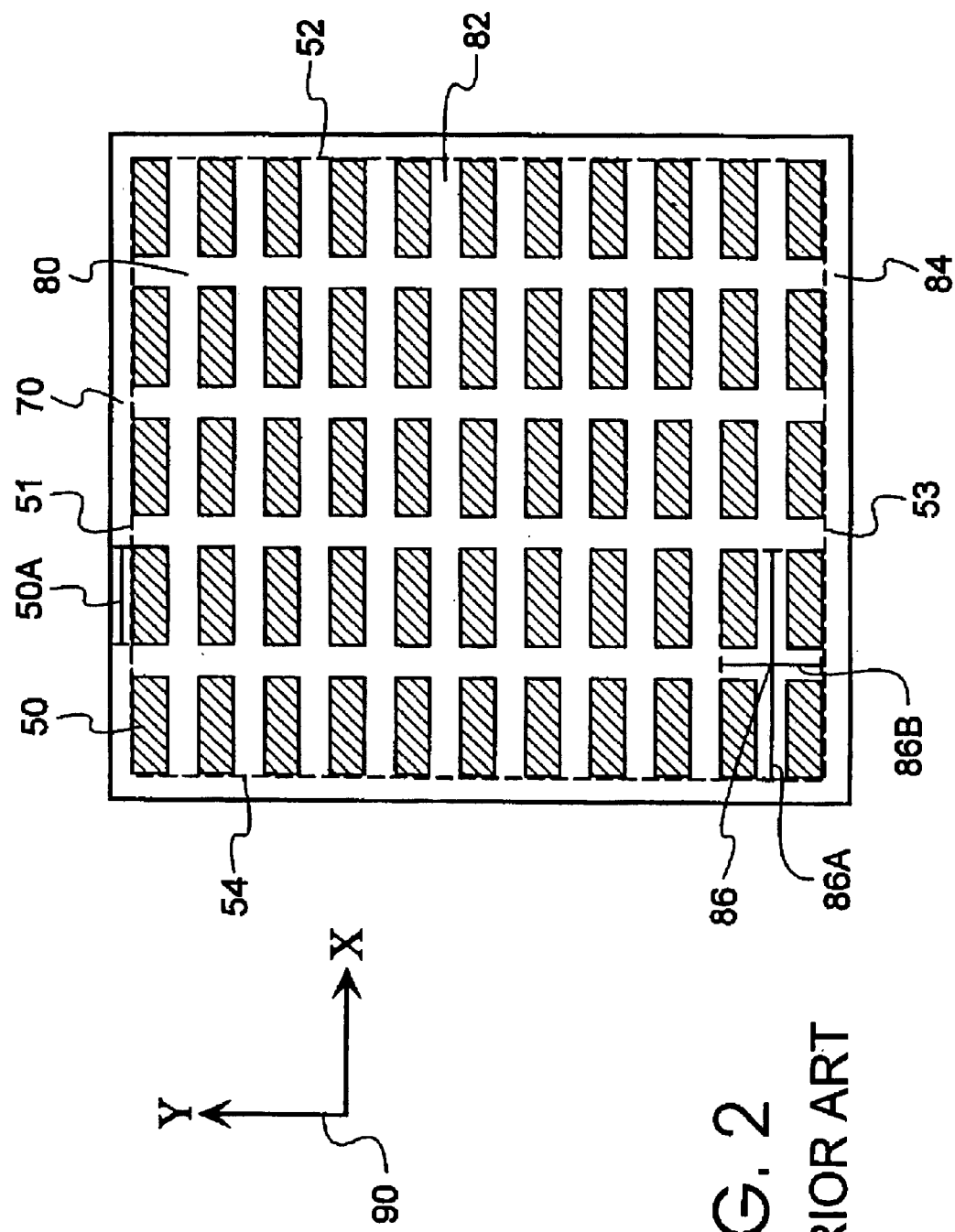
FIG. 2 is a top view of a fill pattern according to the prior art.
Figure 3:
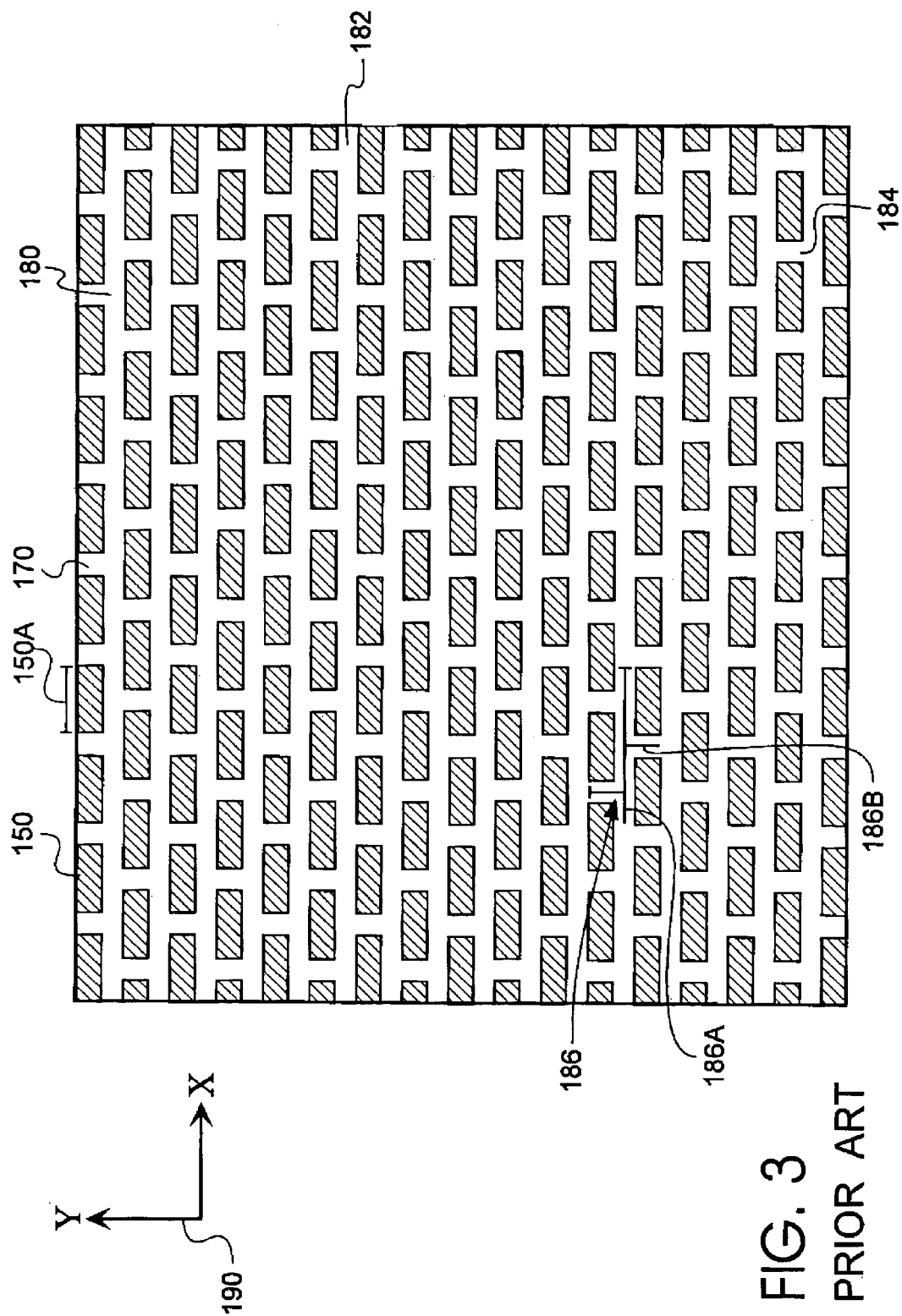
FIG. 3 is a top view of an alternate fill pattern according to the prior art.
Figure 4:
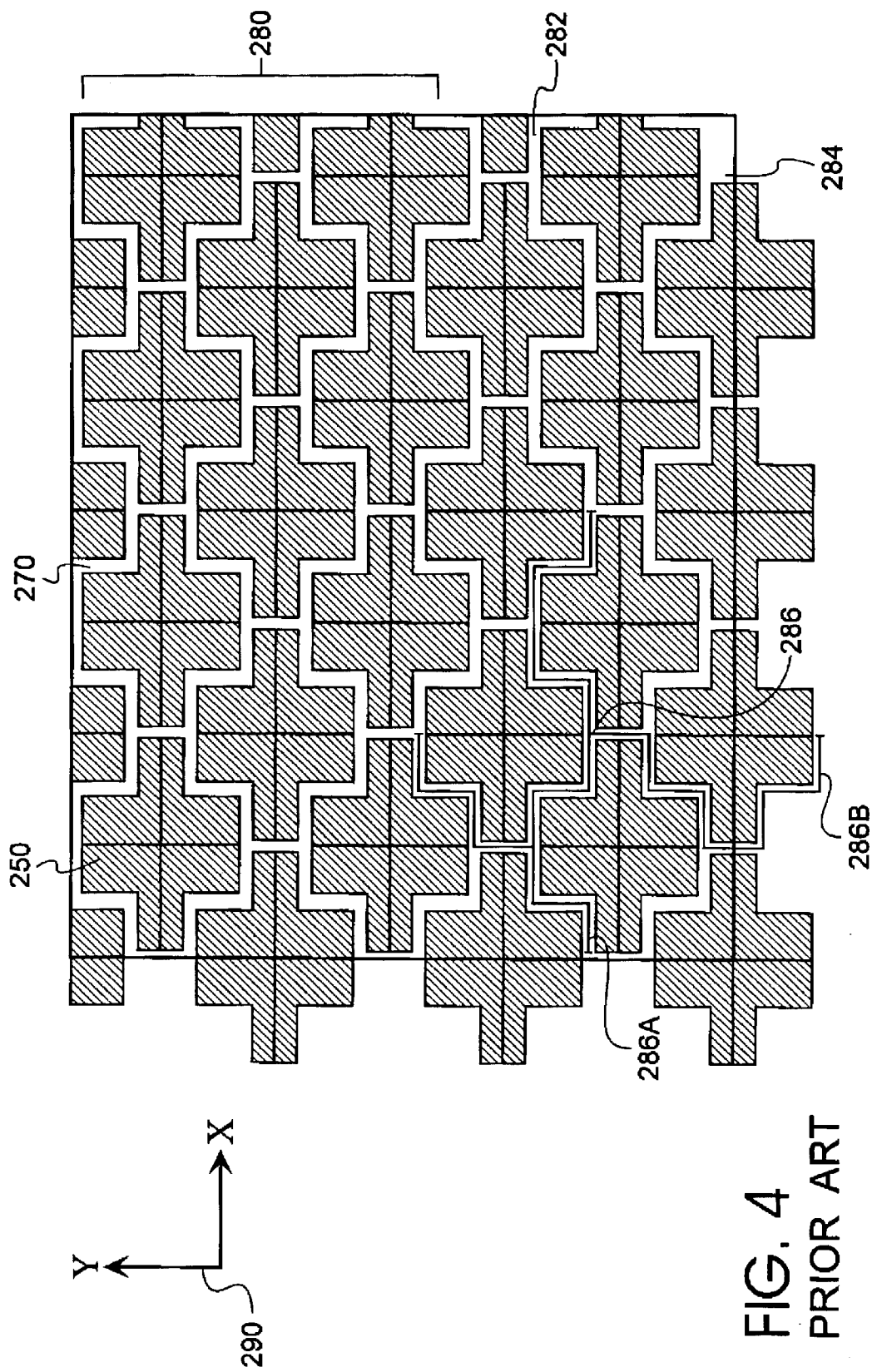
FIG. 4 is a top view of still another fill pattern according to the prior art.

Referring now to FIGS. 2–4, examples of prior art fill patterns are shown. In FIG. 2, dummy patterns 50 are arranged in a repeating array 70. A repeating, two-dimensional grid pattern 80 disposed within the array 70 is made up of horizontal spaces (alternatively referred to as gaps) 82, vertical spaces 84 and intersections 86 comprising vertical and horizontal space crossings. Note that an intersection requires more than a mere meeting of spaces in two different dimensions, but must have each of the spaces actually cross such that they both extend on both sides beyond the intersection point. As such, a corner or a T-shaped junction does not qualify as an intersection in the present context. These spaces and intersections of spaces provide pathways through which the insulative material, whether it be SOG, TEOS or a related compound, flows to form the planarization layer. It is noted that the intersections 86 of the device shown in FIG. 2 includes uninterrupted linear dimensions 86A and 86B. In the present context, the term "uninterrupted linear dimension" refers to one of the space or gap dimensions that contain no breaks, discontinuities or changes in direction between adjacent intersections. Stated another way, an uninterrupted linear dimension describes structure that extends in a generally straight fashion such that it can coincide with a single coordinate in a conventional Cartesean layout 90, with no changes in direction. By way of contrast with the device shown in FIG. 2, neither of the intersections of FIGS. 3 and 4 evidence uninterrupted linear dimensions, as the vertical dimension 186B of FIG. 3, and both the horizontal and vertical dimensions 286A and 286B of FIG. 4 deviate from the required linearity between adjacent intersections. It is also noted that both the horizontal and vertical spaces 82, 84 of FIG. 2 are of linear dimensions longer than that of the longest dimension 50A of dummy pattern 50, while in FIG. 3, the horizontal space 182 is longer, although the maximum vertical space 184 is not, being approximately the same height as dummy pattern 150A is long. The present inventors have discovered that both of these fill pattern features, long linear spacings and uninterrupted linear intersections of spacings, contribute to the conformal "troughing" of the deposited planarization layer, and thus need to be eliminated or minimized. Thus, while each of the fill patterns shown in FIGS. 2–4 individually include desirable fill features, such as straight edges around the periphery defined mostly by the alignment 51–54 of the straight edges of dummy patterns 50 such that no portions of the dummy patterns 50 project over an array periphery (FIG. 2), simple arrays (FIGS. 2 and 3), no long linear space dimensions (FIG. 4) and no uninterrupted linear space crossings at the intersections (FIGS. 3 and 4), none provide all of the features needed to ensure smooth planar insulative layers.

Referring now to FIGS. 5A–5D, a pair of fill patterns 350, 351 have been combined to form a composite fill pattern 355. The fill (or dummy) patterns, as well as the conductive lead lines (not shown) are built-up from a generally planar surface into a three-dimensional topographic structure, such that the footprint of the structures projects a two-dimensional image onto the substrate. Typically, the fill patterns are of geometrically simple designs, such as rectangles, or various shapes resembling a cross, or the letters "T" or "L". This promotes ease of integration into the interstitial areas between conductive lead lines (not shown) deposited on a semiconductor substrate, as well as lower fabrication costs due to simple cutouts on the mask or reticle. Moreover, the fill patterns are made of an electrically conductive material, such as metal. In addition, they are typically deposited on a semiconductor substrate (not shown) at the same time, and as part of the same process as the conductive lead lines. Referring now to FIG. 5B, a small portion of repeating array 370 of fill patterns 350, 351 is shown. The repeating nature of array 370 is such that the one or more fill pattern shapes are placed in an orderly geometric way to be as simplistic as possible through the creation of relatively uniform spacing between the fill patterns. In addition, the array 370 defines a periphery 375 such that none of the projections of the fill patterns 350, 351 extend beyond the boundary of the array 370 set up by periphery 375. This, too facilitates low cost fabrication, as repeating array profiles are easier to set up and produce. Preferably, an alignment of the outer edges of the fill patterns 350 creates the straight, even boundary defined by each array 370.

Disposed within array 370 is a grid 380, also known as a gridded valley, specifically shown in FIG. 5D. Unlike array 370, grid 380 need not have a straight periphery 375. Instead, the grid 380 can, and preferably does include jagged, tortuous paths of spaces interspersed among the fill patterns 350, 351 and conductive lead lines (not shown). The spaces 385 are bounded on the sides by these upstanding topographic structures, such as the fill patterns 350, 351 and conductive lead lines (not shown), and on the bottom by the substantially planar surface of the layer below, such as the substrate 388 of the semiconductor. Preferably, spacing of the topographic structures is such that the width of the spaces 385 is uniform throughout the array 370, thus promoting ease of depositing and consistent quality of the planarization layer (such as SOG or TEOS, shown representatively as 20 in FIGS. 1A and 1B, or any related ceramic or similar insulator). The spaces 385, in conjunction with the side walls of the fill patterns and conductive lead lines, make up three-dimensional valleys as part of the grid into which the planarization layer may be deposited. These valleys circumscribe the topographic "peaks" of the fill patterns 350, 351 and conductive lead lines. The planarization layer is preferably deposited to a thickness that ensures that the top surface of the planarization layer is generally coplanar with the top surfaces of the fill patterns 350, 351 and conductive lead lines. As an analogous way to visualize the interrelationship between the topographic fill patterns, topographic and conductive lead lines, peaks, valleys, spaces, gaps, grids and arrays, it is helpful to think of the array as an overhead view of a few blocks of the downtown section of a metropolitan area, where the topographic structures (fill patterns and conductive lead lines) are three-dimensional buildings and skyscrapers, while the spaces (or valleys) are the two-dimensional crisscrossing streets that separate the buildings and skyscrapers. The grid (or gridded valley) can be thought of as portions of the array with an overhead outline traced by the various streets and their intersections.

Within the grid 380, the spaces 385 and valleys 395 (discussed in more detail in conjunction with FIG. 8 below) are ranged such that the deposition of the planarization layer is not be permitted to accelerate too rapidly in the in-plane directions of the substrate, thereby causing the aforementioned troughing of the top surface. To accomplish this, the longest that the linear dimensions of the spaces and valleys are permitted to assume is that of the longest dimension of the longest fill pattern. In other words, the longest continuous linear extension of a space or valley in either the x or y direction is limited to the longest x or y direction projection of the longer of the fill patterns 350, 351. As can be seen in the figure, the longest linear dimension 395D (which extends from one fill pattern 350 to the next comparable fill pattern 350) of any of the valleys 395 is no greater than the longest lateral dimension 350L of fill patterns 350, 351, The tortuous paths taken by the planarization layer militates against its rapid acceleration during depositions, a phenomenon especially prevalent with SOG techniques. In a similar fashion (and with a similar purpose), the places defining intersections between the numerous spaces (or valleys) have offset features built in. Thus, rather than having a straight-through extension of one of the crossing spaces as it passes through the intersection, the interspersed fill patterns 350, 351 are staggered, thus forcing interruptions, breaks and discontinuities in the otherwise linear extensions of the spaces. The substrate itself defines two generally orthogonal in-plane dimensions (x, y) that coincide with the Cartesian coordinate system 390. Accordingly, any projection in an in-plane direction is one that extends only within that plane.

One way to define the spacing relationship between the fill patterns is by the pitch P of the fill pattern. Pitch P (as shown in FIG. 5D) is typically the distance between like fill pattern points in an array of fill patterns. Referring now to FIGS. 6A–6C in conjunction with FIGS. 5A and 5D, when the ratio of the pitch P to the correspondingly aligned linear dimension L of the fill pattern is less than one, there exists a negative spacing such that the individual fill patterns overlap by the difference in length between L and P (as shown in FIG. 6A); when the ratio equals one, as shown in FIG. 6B, then the individual fill patterns are aligned such that there is neither an overlap nor a gap between adjacent fill patterns; when the ratio is greater than one, shown in FIG. 6C, there is a gap G that forms between adjacent fill patterns 350, 351. Referring now to FIG. 5B, a portion of each of the composite fill patterns 355 are shown as overlapping one another along the horizontal (x) direction shown at coordinate system 390, while FIG. 5C shows the overlap in both the horizontal and vertical dimension. This overlap (where P is less than L) permits the uniform lateral spacing of the composite fill patterns 355. The term "lateral" denotes dimensions generally aligned with one of the two major coordinate axes (x, y) in coordinate system 390, where such major coordinate axes preferably align with the flow directions permitted by the placement of fill patterns 350, 351. In this context, fill pattern 350 of FIG. 5D includes a lateral dimension 350L that generally coincides with the "v", or vertical, axis as shown. A similar lateral dimension also generally coincides with the "x", or horizontal, axis as shown. Accordingly, neither a diagonal dimension, nor a discontinuous, broken path would constitute a lateral dimension. Similarly, the terms "generally", "substantially" and related variants refer to an arrangement of elements or features that, while in theory would be expected to exhibit exact correspondence or behavior, may, in practice embody something slightly less then exact. Accordingly, for example, when something is "substantially aligned" or "generally planar" in the present context, its qualities, while tending toward exact or absolute, need not be. By appropriate consideration of fill pattern lateral dimensions, and spacing between them, an even distribution of planarization layer (not shown) throughout the array 370 (best shown in FIG. 5D) is effected. This can also effect the grid configuration, in that the effect on the important linear and lateral dimensions, as well as intersection dimensions, needs to be considered.

In contrast with each of the devices shown in FIGS. 2–4, the arrangement of the topographic fill patterns 350, 351 in FIGS. 5A–5D includes all of the aforementioned features needed to promote smooth, level planarization layers, such as: geometrically simple features that repeat in regular arrays that are simple to fabricate; no portion of the fill patterns project over the array periphery 375; the longest linear dimension of the valleys or spaces is no longer than the longest lateral dimension on any of the larger fill patterns 350; and no intersection between any of the spaces includes an uninterrupted linear dimension.

Figure 7A:
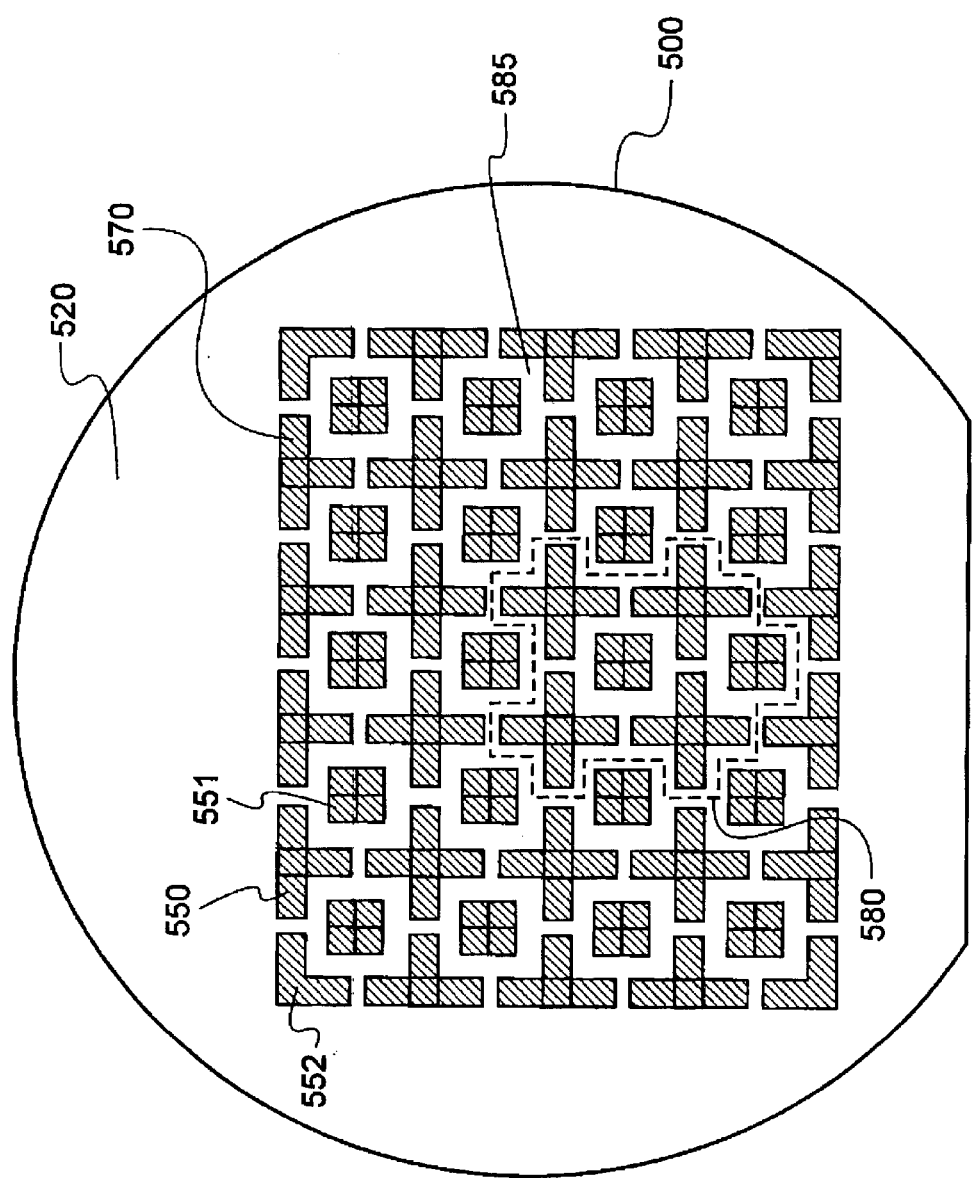
FIG. 7A is a top view of a reticle with cutouts representative of the embodiment shown in FIG. 6A.
Figure 7B:
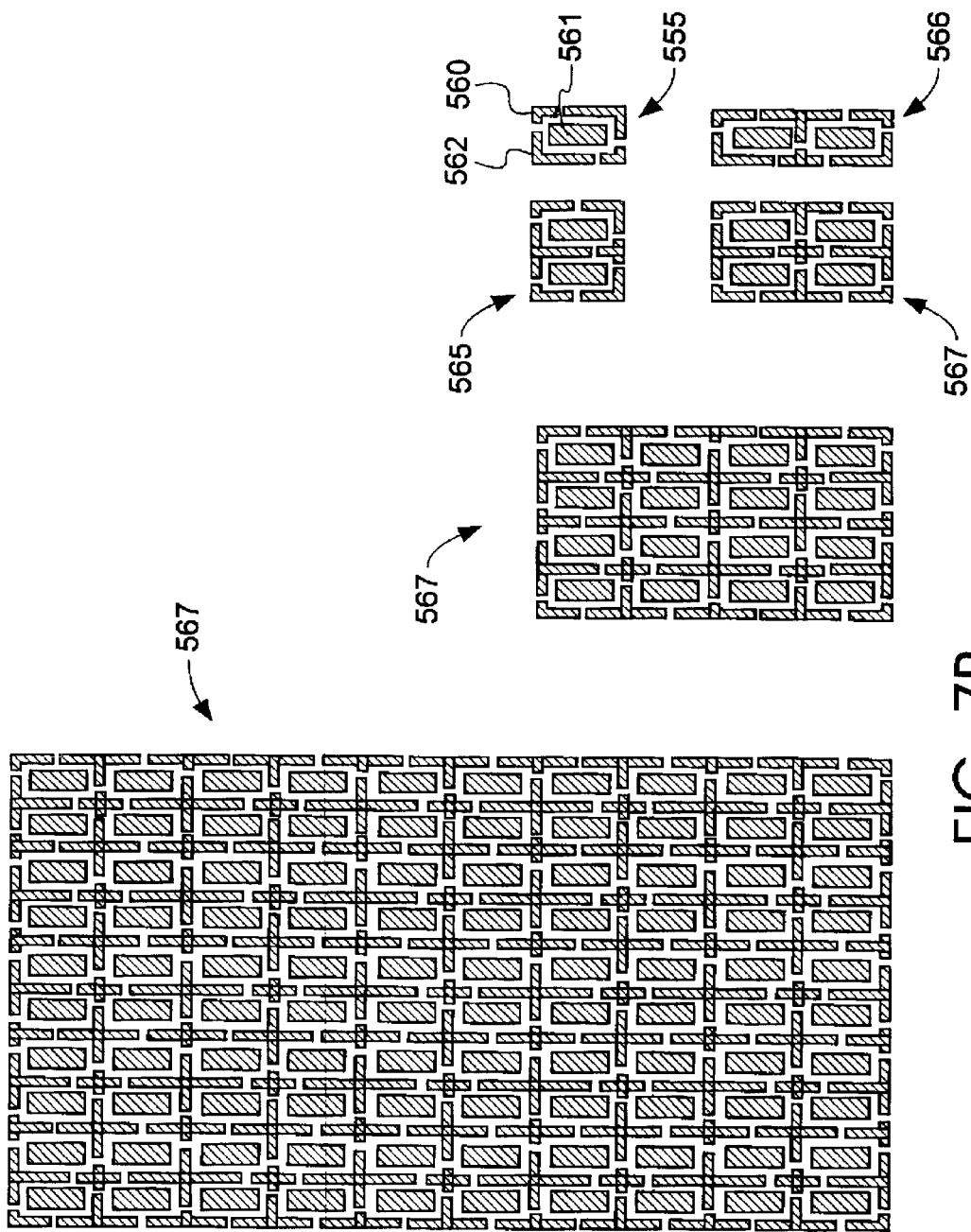
FIG. 7B is a top view of a variation of the cutout pattern shown in FIG. 7A, highlighting a single pattern as well as horizontal, vertical and planar extensions of the pattern where the pitch is less than the lateral spacing of the pattern.

As shown in FIG. 7A, a reticle 500 with body 510 is shown. Body 510 includes a surface 520 into which an array 570 of cutouts 550, 551, 552 are disposed. These cutouts are configured such that the cutout pitch is less than the lateral spacing. A reticle with this configuration will lead to a fill pattern spacing similar to that of FIG. 6A. Typically, the reticle 500 (or mask) is placed between a semiconductor substrate (not shown) and a electromagnetic radiation source, such as a light (not shown). The cutouts 550, 551, 552 permit light to pass through discrete locations on reticle 500, thus illuminating corresponding spots on the photoresist-coated substrate, which causes the photoresist to harden and remain in place while the unexposed photoresist is removed, typically with the help of a solvent. The use of reticle 500, or another with a different cutout configuration, can be used again at a later stage in the build-up of topographic structures. Representative grid 580 is part of the reticle body 510 remaining after cutouts 550, 551 and 552 have been established, and is made up of a first and second set of interconnected series of spaces 585, which extend in the x-y dimensions of the surface 520. Preferably, the spaces 585 are between 0.25 and 0.5 microns wide in a lateral direction. As previously described, the longest linear dimension of the interconnected series of spaces 585 is no longer than the longest dimension of any of the fill pattern cutouts 550, 551, 552. Referring now to FIG. 7B, a variation on the cutout pattern of FIG. 7A is shown, as well as the individual cutouts 560, 561 and 562 that make up composite cutout 555, and their horizontal, vertical and planar extensions 565, 566 and 567, respectively.

Figure 7C:
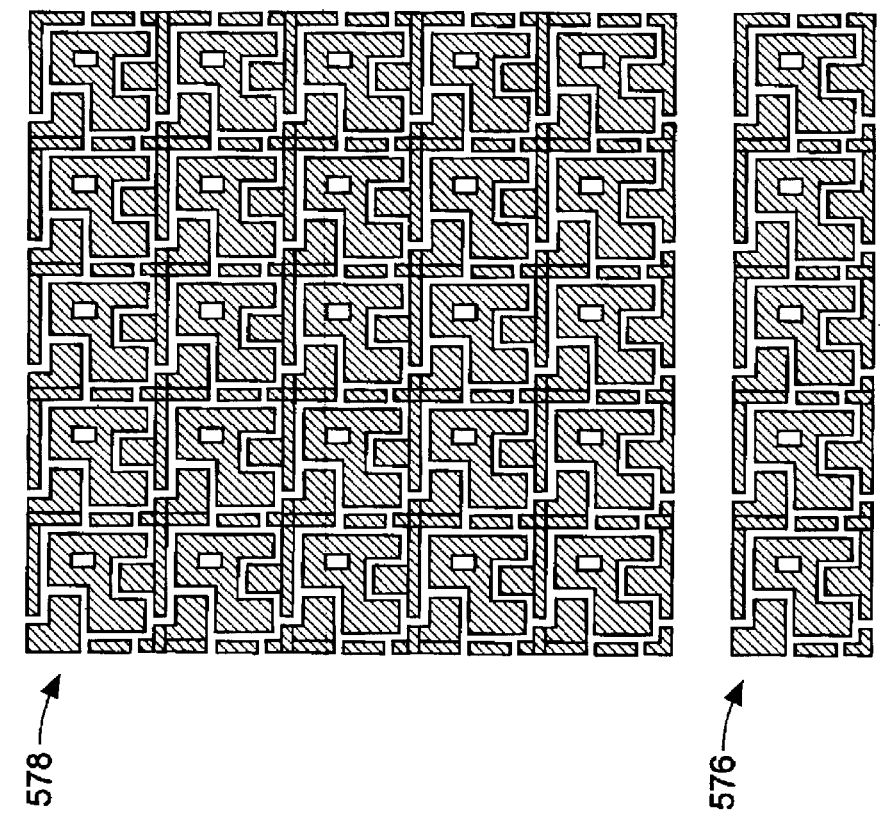
FIG. 7C is a top view of a variation of the cutout pattern using different geometric shapes, as well as horizontal, vertical and planar extensions of the pattern where the pitch is less than the lateral spacing of the pattern.
Figure 7D:
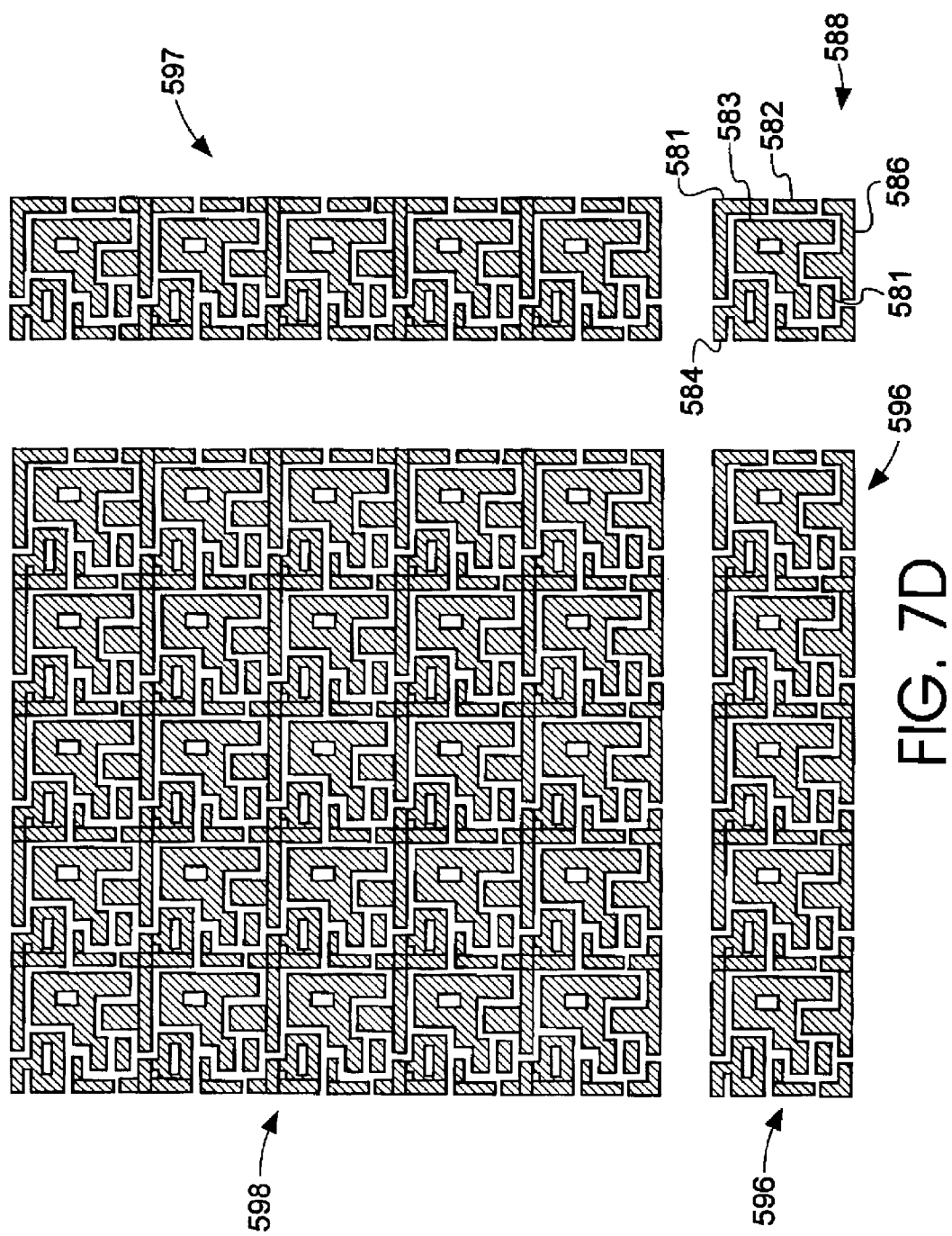
FIG. 7D is a top view of a variation of the pattern in FIG. 7C using different geometric shapes.

Referring now to FIGS. 7C and 7D, additional variations on the reticle cutout configurations, where the geometric shapes of the cutout patterns 571, 572, 573, and 574, making up the composite cutout pattern 570 (shown in FIG. 7C), and cutout patterns 581, 582, 583, 584, 586 and 587, making up the composite cutout pattern 588 (shown in FIG. 7D) are shown including modified rectangles and related shapes. Similarly, horizontal, vertical and planar extensions 576, 577 and 578 of FIG. 7C and 596, 597 and 598 of FIG. 7D may be constructed.

Figure 8:
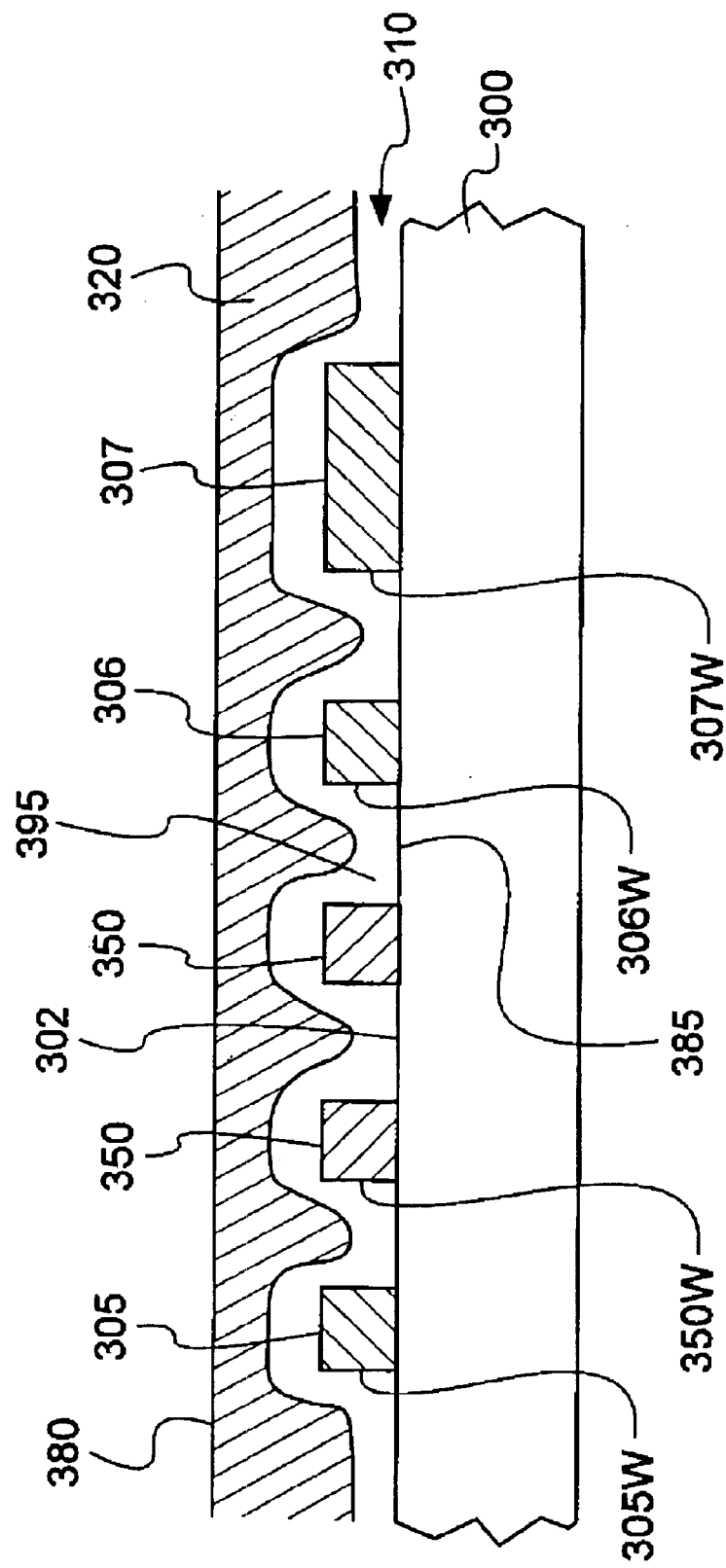
FIG. 8 is an elevation view of the fill pattern according to the present invention.

Referring now to FIG. 8, a view showing the even spacing of fill patterns 350 and conductive lead lines 305, 306 and 307 shows how an even planarization layer 320 is produced. The distance between adjacent fill patterns 350 and conductive lead lines 305, 306, 307, or any combination thereof, defines space 385. In addition, the space 385, between the upper surface of substrate 392, in conjunction with the upstanding sidewalls 350W, 305W, 306W and 307W define valleys 395. With a substantially uniform spacing of fill patterns 350 and conductive lead lines 305, 306, and 307, the lateral dimension of space 385 should be substantially the same throughout the entire array.

Figure 9:
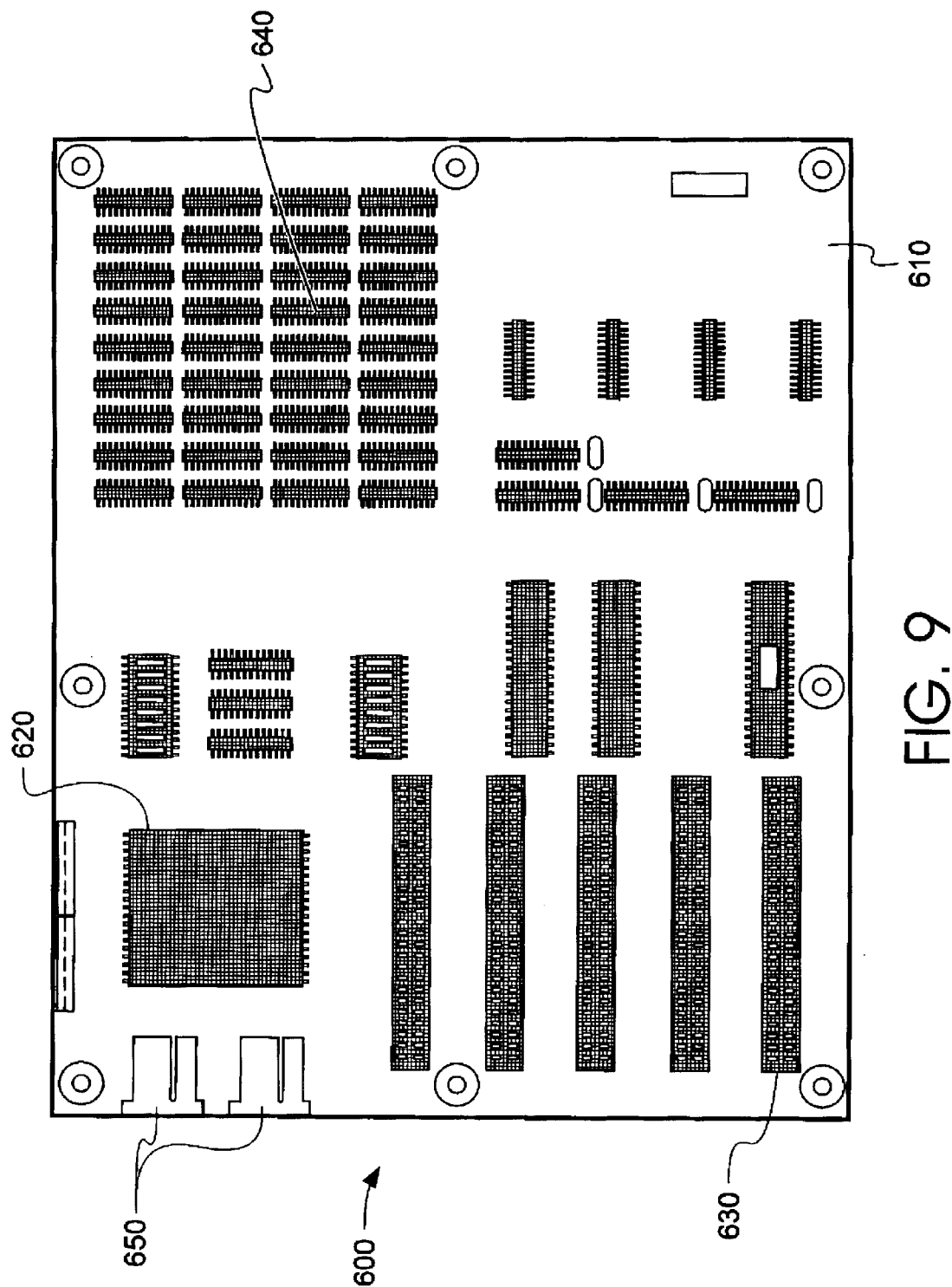
FIG. 9 is a top view of a motherboard including semiconductor devices according to an embodiment of the present invention.

Referring now to FIGS. 9 and 10, a computer motherboard 600 (FIG. 9) and a block diagram of the layout of a typical computer system 700 are shown. In FIG. 9, the motherboard 600 includes various components to connect the various functions of the central processor, controls, input, output and memory, such as a generally planar board 610, mount 620 for microprocessor, mount 630 for expansion slots, mount 640 for memory, and connectors to establish signal links with other components. FIG. 10 depicts the basic interconnections of the major elements of a computer system. The structures discussed herein are typically associated with the microprocessor 710, memory 750, and to some extent the controllers, which may include, among other things, chip sets (not shown).

While the embodiments and systems discussed herein have been directed to a particular fill pattern, it is within the scope of the present invention to include similar simplistic, repeating arrangements to achieve the same end. Thus, having described the present invention in detail and by reference to the embodiments thereof, it will be apparent that modifications and variations are possible without departing from the scope of the invention in the following claims.

What is claimed is:

1. A semiconductor device comprising:

a substrate;

first topographic patterns deposited over said substrate;

second topographic patterns deposited over said substrate, where said first and second topographic patterns define active lead lines and dummy fills, respectively;

an array over said substrate, said array comprising a plurality of valleys circumscribing first and second topographic patterns, said array configured such that:
the periphery of said array is substantially bounded by straight edges of said plurality of dummy fills, said active lead lines, or a combination of both; and
no portion of any of said plurality of dummy fills extends laterally beyond said periphery;

a grid disposed within said array such that:
the longest linear dimension of each of said plurality of valleys making up said grid is no longer than the longest lateral dimension of any of said dummy fills; and
no intersection defined by a crossing between any two of said plurality of valleys includes uninterrupted linear dimensions; and a substantially planar layer of insulative material deposited over said plurality of valleys, said planar layer having a thickness sufficient to render a top surface thereof substantially co-planar with a top surface of said first and second topographic patterns.

2. A semiconductor device comprising:

a substrate with a plurality of peaks and valleys, where said plurality of peaks are defined by at least one topographic conductive line spaced apart from a plurality of topographic dummy patterns, and said plurality of valleys are defined by interpeak spaces;

a repeating array defined by at least a portion of said plurality of peaks and valleys, wherein:
  the periphery of said array is substantially bounded by straight edges of said plurality of topographic dummy patterns; and
  no portion of any of said plurality of topographic dummy patterns within said array extends laterally beyond said periphery of said array;

a substantially planar grid disposed within said array, said substantially planar grid made up of said interpeak spaces that extend in substantially orthogonal directions from one another within said substantially planar grid such that:
  the longest linear dimension of each of said interpeak spaces making up said grid is no longer than the longest lateral dimension of any of said dummy patterns; and
  no intersection defined by a crossing between any two of said interpeak spaces includes uninterrupted linear dimensions; and a substantially planar layer of insulative material deposited over said valleys, said planar layer having a thickness selected to render a top surface thereof substantially co-planar with a top surface of said peaks.

3. A semiconductor device according to claim 2, wherein a lateral dimension defining a width of any one of said interpeak spaces is substantially the same as the width of all other said interpeak spaces.

4. A semiconductor device according to claim 3, wherein said insulative material is an oxide-based ceramic.

5. A semiconductor device comprising:

a substantially planar substrate;

a plurality of first topographic structures comprising conductive lead lines deposited over said substantially planar substrate, said plurality of first topographic structures including a top surface;

a plurality of second topographic structures comprising fill patterns with top surfaces thereon, said top surfaces of said plurality of second topographic structures generally co-planar with said top surfaces of said plurality of first topographic structures;

at least one geometrically simple array comprising at least a portion of said plurality of first and second topographic structures such that:
  the periphery of said at least one geometrically simple array is substantially bounded by straight edges of said plurality of second topographic structures; and
  no portion of said plurality of said second topographic structures within said array extends laterally beyond said periphery;

a gridded valley disposed within said array, said gridded valley comprising an interconnected series of spaces between adjacent ones of said first and second topographic structures, such that:
  the width of each of said interconnected series of spaces is substantially equal:
    the longest linear dimension of each of said series of spaces is no longer than the longest dimension of any of said second topographic structures; and
    no intersection defined by a crossing between any two of said interconnected series of spaces includes uninterrupted linear dimensions; and a planarization layer deposited over said substantially planar substrate such that it is disposed at least within said gridded valley and laterally surrounds said plurality of first and second topographic structures.

* * * * *

UNITED STATES PATENT AND TRADEMARK OFFICE
CERTIFICATE OF CORRECTION

PATENT NO. : 6,777,813 B2  
DATED : August 17, 2004  
INVENTOR(S) : Juengling et al.

It is certified that error appears in the above-identified patent and that said Letters Patent is hereby corrected as shown below:

Title page,  
Item [54], Title, "FILL PATTERN GENERATION FOR SPIN-ON-GLASS AND RELATED SELF-PLANARIZATION DEPOSITION" should read -- FILL PATTERN GENERATION FOR SPIN-ON GLASS AND RELATED SELF-PLANARIZATION DEPOSITION --

Column 8,  
Line 26, "350, 351," should read -- 350, 351. --  
Line 67, ""v"," should read -- "y", --

Signed and Sealed this

Twenty-third Day of November, 2004

JON W. DUDAS  
*Director of the United States Patent and Trademark Office*